US012631709B2

(12) United States Patent
Agneessens et al.

(10) Patent No.: US 12,631,709 B2
(45) Date of Patent: May 19, 2026

(54) DIRECTION DETERMINING FOR OVER-THE-AIR TESTING OF A RADIO TRANSCEIVER DEVICE

(71) Applicant: Telefonaktiebolaget LM Ericsson (PUBL), Stockholm (SE)

(72) Inventors: Sam Agneessens, Torslanda (SE); Torbjörn Elfström, Fjärås (SE); Jonas Fridén, Onsala (SE); Aidin Razavi, Gothenburg (SE)

(73) Assignee: Telefonaktiebolaget LM Ericsson (PUBL), Stockholm (SE)

( * ) Notice: Subject to any disclaimer, the term of this patent is extended or adjusted under 35 U.S.C. 154(b) by 413 days.

(21) Appl. No.: 18/041,702

(22) PCT Filed: Aug. 20, 2020

(86) PCT No.: PCT/EP2020/073445
§ 371 (c)(1),
(2) Date: Feb. 15, 2023

(87) PCT Pub. No.: WO2022/037788
PCT Pub. Date: Feb. 24, 2022

(65) Prior Publication Data
US 2023/0296715 A1     Sep. 21, 2023

(51) Int. Cl.
*G01S 3/14*        (2006.01)
*G01R 29/08*       (2006.01)
(52) U.S. Cl.
CPC .......... *G01S 3/143* (2013.01); *G01R 29/0892* (2013.01)

(58) Field of Classification Search
None
See application file for complete search history.

(56) References Cited

U.S. PATENT DOCUMENTS

| | | | |
|---|---|---|---|
| 2016/0149302 A1 | 5/2016 | Sanderovich et al. | |
| 2016/0277089 A1 | 9/2016 | Jung et al. | |
| 2019/0312617 A1* | 10/2019 | Wernersson | ......... H04B 7/0486 |

FOREIGN PATENT DOCUMENTS

WO     WO2018184455 A1 *   10/2018

OTHER PUBLICATIONS

EPO Communication under Rule 164(2)(a) EPC issued for Application No. 20 761 202.9-1206—Aug. 14, 2024.
(Continued)

*Primary Examiner* — Whitney Moore
(74) *Attorney, Agent, or Firm* — Baker Botts L.L.P.

(57) ABSTRACT
There is provided mechanisms for determining direction of a second radio transceiver device with respect to a first radio transceiver device. The first radio transceiver device is configured to communicate with beams in a beam set. A method is performed by a processing unit. The method comprises obtaining a vector of radio parameter measurements from measurements performed on a radio link between the first radio transceiver device and the second radio transceiver device for one and the same location of the second radio transceiver device. The vector comprises a radio parameter measurement per each beam in the beam set. The method comprises determining the direction of the second radio transceiver device with respect to the first radio transceiver device by comparing the vector of radio parameter measurements to a set of candidate direction profiles.

20 Claims, 8 Drawing Sheets

(56)     References Cited

OTHER PUBLICATIONS

PCT International Search Report issued for International application No. PCT/EP2020/073445—Jun. 18, 2021.
PCT Written Opinion of the International Searching Authority issued for International application No. PCT/EP2020/073445—Jun. 18, 2021.

* cited by examiner

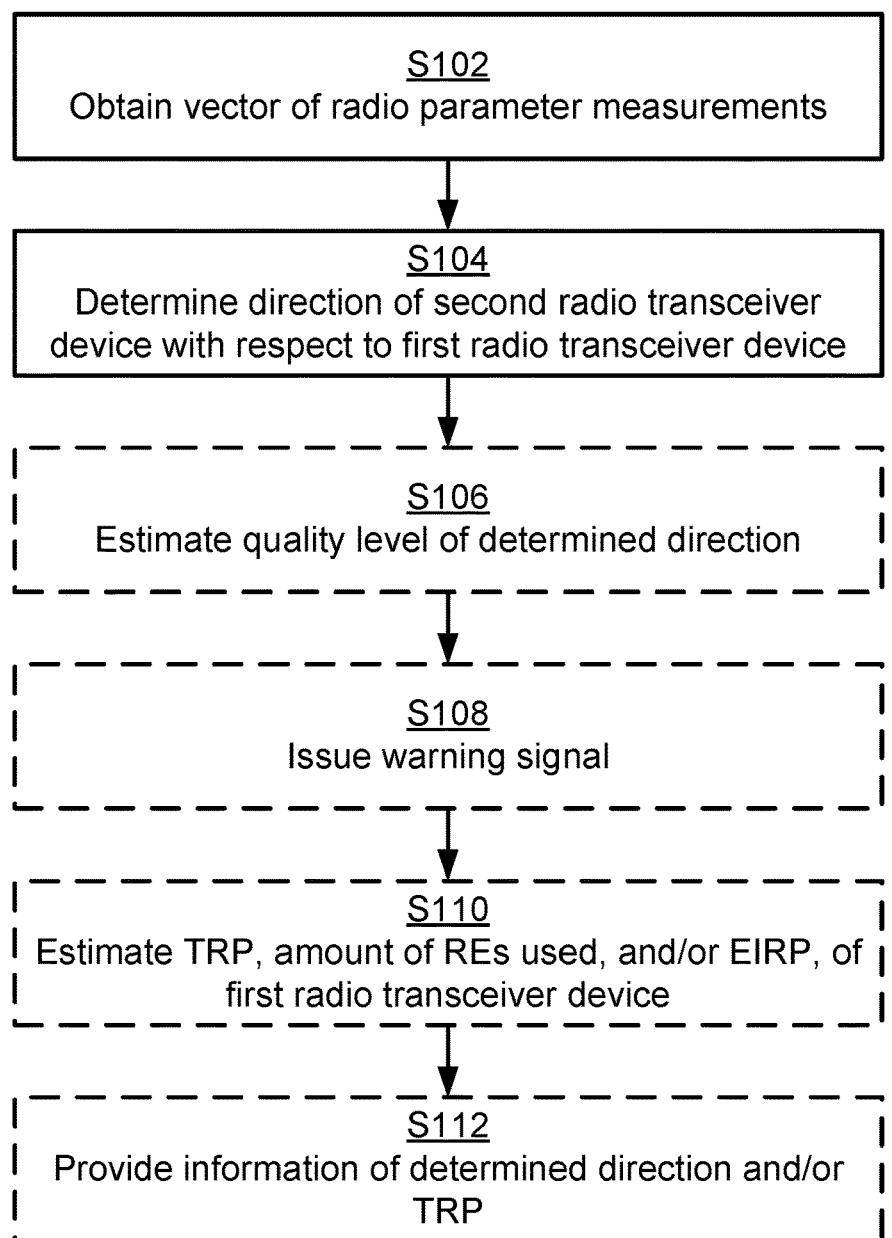

S102
Obtain vector of radio parameter measurements

S104
Determine direction of second radio transceiver
device with respect to first radio transceiver device S106
Estimate quality level of determined direction S108
Issue warning signal S110
Estimate TRP, amount of REs used, and/or EIRP, of
first radio transceiver device S112
Provide information of determined direction and/or
TRP

Fig. 3

DIRECTION DETERMINING FOR OVER-THE-AIR TESTING OF A RADIO TRANSCEIVER DEVICE

PRIORITY

This nonprovisional application is a U.S. National Stage Filing under 35 U.S.C. § 371 of International Patent Application Serial No. PCT/EP2020/073445 filed Aug. 20, 2020 and entitled "DIRECTION DETERMINING FOR OVER-THE-AIR TESTING OF A RADIO TRANSCEIVER DEVICE" is hereby incorporated by reference in its entirety.

TECHNICAL FIELD

Embodiments presented herein relate to a method, a processing unit, a computer program, and a computer program product for determining direction of a second radio transceiver device with respect to a first radio transceiver device.

BACKGROUND

When any radio equipment is to be deployed, regulatory RF electromagnetic field (EMF) exposure requirements should be accounted for. These RF EMF exposure regulations may typically be based on the guidelines from the International Commission on Non-Ionizing Radiation Protection (ICNIRP) but may take different forms in some countries and regions. The aim of RF EMF exposure regulations is to ensure that human exposure to RF energy is kept within prescribed limits, which typically have been set with wide safety margins.

Some newly developed base stations and other radio equipment are equipped with so-called active antenna systems (AAS). These antenna systems increase the capacity and/or coverage compared to traditionally used antenna system by addition of one or more antenna arrays. In turn, this enables the simultaneous transmission of parallel data streams between a base station on the network side and a terminal device at the user-side by means of so-called multiple-input-multiple-output (MIMO) transmission.

For base stations and other radio equipment having AAS systems with a large number of antenna elements in order to achieve a high directivity, there may be a large maximum beamforming gain. The term directivity generally refers to a measure of how 'directional' the radiation pattern of an antenna is. A consequence of a large beamforming gain is typically that the radiated power is concentrated in directional beams (i.e., having high directivity), meaning that the Equivalent Isotropic Radiated Power (EIRP) rating of the base station, i.e. the equivalent power radiated from an antenna with unity antenna gain in all directions, is increased as compared to the situation without AAS systems. EIRP as a parameter is defined by IEEE in IEEE Standard for Definitions of Terms for Antennas (IEEE Std 145-2013).

Traditionally, deployed base stations are periodically monitored in field during operating. One reason is to check on basic RF performance, such as output power, frequency error and radio emissions. One reason is to secure coexistence within the network and with other services. The monitoring might be conducted through measuring RF parameters, either at the RF connector at the transceiver, or OTA as EIRP measurements. For EIRP measurements, assumptions regarding the antenna gain is required.

In specifications 3GPP TS 37.105 entitled "Active Antenna System (AAS) Base Station (BS) transmission and reception", Release 15, and 3GPP TS 38.104 entitled "NR; Base Station (BS) radio transmission and reception", Release 15, have been specified OTA requirements. One purpose of in-the-field OTA testing is to, without accessing traditional RF connectors, verify that a base station having an integrated AAS is compliant for deployment. Another reason for in-the-field OTA testing is to mitigate interference situations where the base station in different networks interfere with each other or the base station interferes with other radio based services or systems. To capture the dynamic behaviour of an AAS, requirements, such as output power, have been defined based on total radiated power as a metric.

Different methods, with different levels of accuracy and complexity have been devised for OTA measurements. These methods have been designed to be performed in a controlled lab environment. Further, most of these methods involve performing multiple EIRP measurements at multiple directions around the base station in an Anechoic Chamber (AC) on a specific grid. A Reverberation Chamber (RC) can also be used for this purpose. One measurement method that requires only a single EIRP measurement uses the knowledge of directivity radiation pattern and the direction of the measured value related to the base station. Since knowledge of the directivity radiation pattern is required, this method can only be used for in-band and out-of-band adjacent channel measurements, which limits the usage of this method.

Hence, there is still a need for improved ways to verify that base stations and other radio equipment are compliant in terms of, for example, total radiated power, etc. One challenge when verifying that base stations and other radio equipment are compliant is to ensure that the measurement equipment is correctly positioned.

SUMMARY

An object of embodiments herein is to enable efficient determination that the measurement equipment is correctly positioned with respect to the base station or other radio equipment.

According to a first aspect there is presented a method for determining direction of a second radio transceiver device with respect to a first radio transceiver device. The first radio transceiver device is configured to communicate with beams in a beam set. The method is performed by a processing unit. The method comprises obtaining a vector of radio parameter measurements from measurements performed on a radio link between the first radio transceiver device and the second radio transceiver device for one and the same location of the second radio transceiver device. The vector comprises a radio parameter measurement per each beam in the beam set. The method comprises determining the direction of the second radio transceiver device with respect to the first radio transceiver device by comparing the vector of radio parameter measurements to a set of candidate direction profiles. Each candidate direction profile represents one candidate direction of the second radio transceiver device with respect to the first radio transceiver device. Each candidate direction profile comprises a radio parameter estimate per each beam in the beam set. The direction of the second radio transceiver device with respect to the first radio transceiver device is given by the candidate direction of the candidate direction profile that, according to a similarity measure, is most similar to the vector of radio parameter measurements.

According to a second aspect there is presented a processing unit for determining direction of a second radio transceiver device with respect to a first radio transceiver device. The first radio transceiver device is configured to communicate with beams in a beam set. The processing unit comprises processing circuitry. The processing circuitry is configured to cause the processing unit to obtain a vector of radio parameter measurements from measurements performed on a radio link between the first radio transceiver device and the second radio transceiver device for one and the same location of the second radio transceiver device. The vector comprises a radio parameter measurement per each beam in the beam set. The processing circuitry is configured to cause the processing unit to determine the direction of the second radio transceiver device with respect to the first radio transceiver device by comparing the vector of radio parameter measurements to a set of candidate direction profiles. Each candidate direction profile represents one candidate direction of the second radio transceiver device with respect to the first radio transceiver device. Each candidate direction profile comprises a radio parameter estimate per each beam in the beam set. The direction of the second radio transceiver device with respect to the first radio transceiver device is given by the candidate direction of the candidate direction profile that, according to a similarity measure, is most similar to the vector of radio parameter measurements.

According to a third aspect there is presented a processing unit for determining direction of a second radio transceiver device with respect to a first radio transceiver device. The first radio transceiver device is configured to communicate with beams in a beam set. The processing unit comprises an obtain module configured to obtain a vector of radio parameter measurements from measurements performed on a radio link between the first radio transceiver device and the second radio transceiver device for one and the same location of the second radio transceiver device. The vector comprises a radio parameter measurement per each beam in the beam set. The processing unit comprises a determine module configured to determine the direction of the second radio transceiver device with respect to the first radio transceiver device by comparing the vector of radio parameter measurements to a set of candidate direction profiles. Each candidate direction profile represents one candidate direction of the second radio transceiver device with respect to the first radio transceiver device. Each candidate direction profile comprises a radio parameter estimate per each beam in the beam set. The direction of the second radio transceiver device with respect to the first radio transceiver device is given by the candidate direction of the candidate direction profile that, according to a similarity measure, is most similar to the vector of radio parameter measurements.

According to a fourth aspect there is presented a computer program for determining direction of a second radio transceiver device with respect to a first radio transceiver device, where the first radio transceiver device is configured to communicate with beams in a beam set, the computer program comprising computer program code which, when run on a processing unit, causes the processing unit to perform a method according to the first aspect.

According to a fifth aspect there is presented a computer program product comprising a computer program according to the fourth aspect and a computer readable storage medium on which the computer program is stored. The computer readable storage medium could be a non-transitory computer readable storage medium.

Advantageously, these aspects provide efficient determination that the second radio transceiver is correctly positioned with respect to the first radio transceiver device.

Advantageously, these aspects can be used as part of determining whether or not base stations and other radio equipment are compliant in terms of total radiated power, etc.

Advantageously, these aspects enable accurate direction estimation based on live network measurements.

Advantageously, these aspects can be used to estimate total radiated power (TRP).

Advantageously, these aspects enable pattern recognition to be used to estimate the directivities of each beam, in the given direction, without a priori information of the direction from the first radio transceiver device to the second radio transceiver device.

Advantageously, determining the direction based on actual measured power, helps to reduce the measurement uncertainty, both for the direction as such and for optional estimation of the TRP.

Advantageously, these aspects only require only one or few measurement samples to work, as opposed to many samples in other TRP measurement methods.

Advantageously, these aspects are especially suitable for dynamic systems with narrow beams, without affecting the live network performance.

Advantageously, these aspects are independent of any assumptions on the radiation pattern as used in legacy testing on fixed wide beam patterns. All information is provided in the candidate direction profiles.

Advantageously, these aspects enable live network output power monitoring without the need for a dedicated monitoring port.

Advantageously, these aspects enable measurements to be performed whilst the second radio transceiver device is moved around, e.g. mounted on a moving vehicle, resulting in a very fast collection of a lot of data points which increases reliability in the result.

Advantageously, these aspects enable monitoring of radiated power in real-time. This information can be used by mobile network operators to optimize and calibrate base station power consumption, coverage and interference.

Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, module, step, etc." are to be interpreted openly as referring to at least one instance of the element, apparatus, component, means, module, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which:

FIG. 3 is a flowchart of methods according to embodiments;

DETAILED DESCRIPTION

Figure 1:
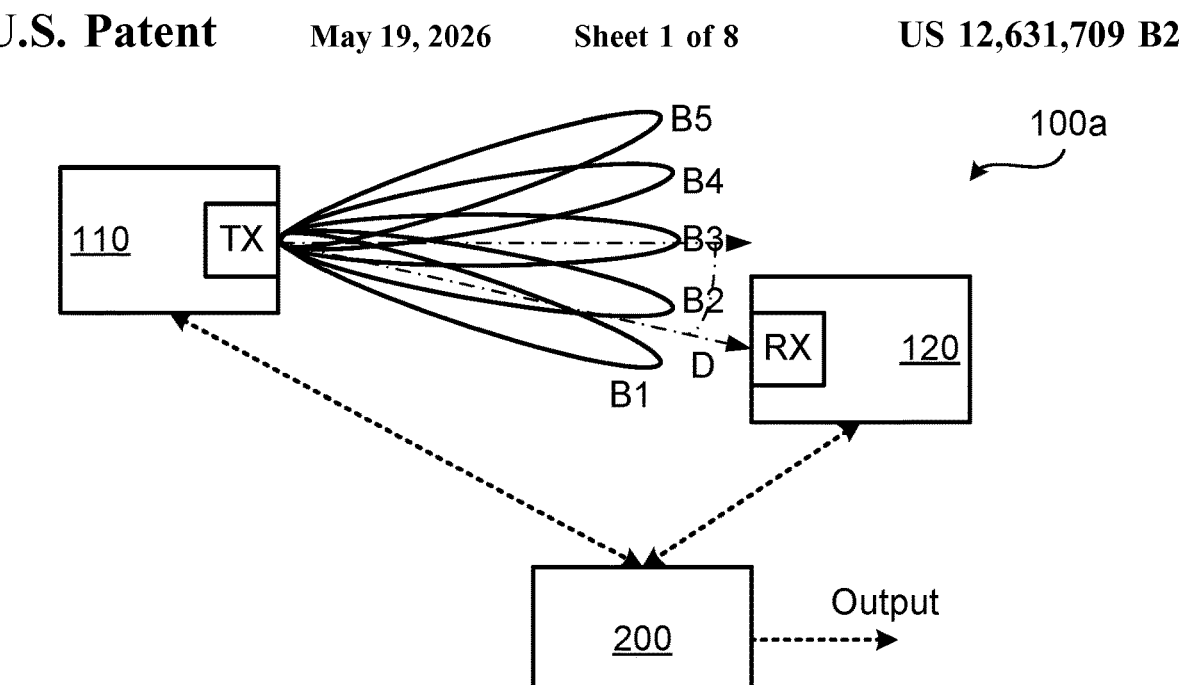
FIGS. 1 and 2 are schematic diagrams illustrating a communication network according to embodiments.

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any step or feature illustrated by dashed lines should be regarded as optional.

As noted above there is still a need for improved ways to verify that base stations and other radio equipment are compliant in terms of total radiated power, etc.

Further in this respect, known EIRP-based OTA measurement methods are designed for measurements in controlled lab environments. Application of these methods to in-the-field live network testing poses practical difficulties. As noted above, these measurement methods involve the use of either an AC or an RC. An OTA measurement method performed in-the-field rules out the use of an RC since it is not practically possible to build an RC around a base station and even if it were practically possible, this would disturb the normal network operation. With respect to measurements methods designed for the use of an AC, multiple EIRP measurements on specific grid points are required. Measuring on a well-defined grid is straightforward in a lab environment, however due to the physical environment in which the base station is deployed (e.g. due to buildings, trees, rocks, streets and other potential physical obstacles) it could be challenging to perform such measurements in the field.

Provided that the directivity of the radiation from the base station and the exact measurement position relative to the base station is known, radio parameters, such as TRP, can be measured OTA from a single EIRP sample. Requirement of the knowledge of the radiation pattern might limit this method to in-band and out-of-band frequency ranges. In general terms, out-of-band emissions (i.e., emissions in the out-of-band frequency ranges) are unwanted emissions immediately outside the channel bandwidth resulting from the modulation process and non-linearity in the transmitter but excluding spurious emissions. Nevertheless, such a method simplifies the measurement for the applicable frequencies. At least in theory, a navigation system, such as the Global Navigation Satellite Systems (GNSS), can be used to solve the positioning question. In practice however, such navigation systems might have limitations and accuracy issues. Furthermore, the actual orientation and possible electrical tilt of the base station might affect the relative position of the measurement point. Recording the orientation of the base station might require physical access to the base station. Furthermore, there might be an uncertainty with respect to the test equipment's relative orientation with respect to the base station's radiation pattern.

The embodiments disclosed herein therefore relate to mechanisms for determining direction of a second radio transceiver device with respect to a first radio transceiver device. In order to obtain such mechanisms there is provided a processing unit, a method performed by the processing unit, a computer program product comprising code, for example in the form of a computer program, that when run on a processing unit, causes the processing unit 200 to perform the method.

Figure 2:
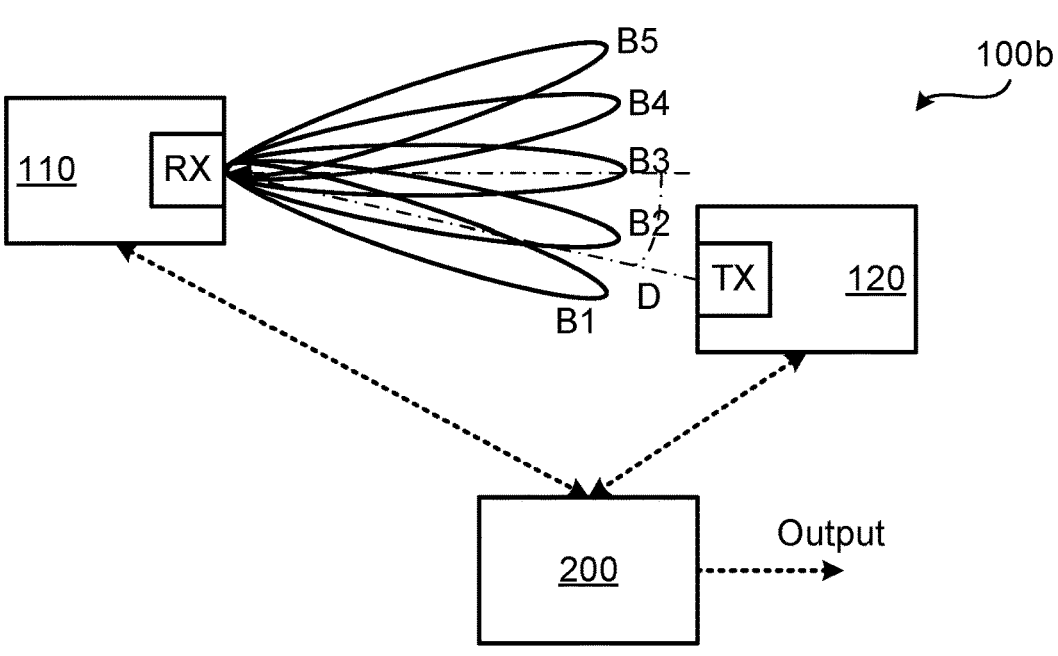

FIG. 1 and FIG. 2 are schematic diagrams illustrating a communication network 100a, 100b where embodiments presented herein can be applied. The communication network 100a, 100b comprises a first radio transceiver device 110, a second radio transceiver device 120, and a processing unit 200.

In some non-limiting examples, the first radio transceiver device 110 is a radio access node. Some non-limiting examples of radio access nodes are: radio access network nodes radio base stations, base transceiver stations, node Bs (NBs), evolved node Bs (eNB), gNBs, access points, and integrated access and backhaul (IAB) nodes. In some non-limiting examples, the second radio transceiver device 120 is a user equipment. Non-limiting examples of user equipment are portable wireless devices, mobile stations, mobile phones, handsets, wireless local loop phones, smartphones, laptop computers, tablet computers, network equipped sensors, network equipped vehicles, and Internet of Things devices.

The processing unit 200 may either be provided as a separate device, or be collocated, integrated, or part of another device, such as the first radio transceiver device 110, the second radio transceiver device 120, or another entity, such as a network controller. The processing unit 200 is configured to, as output, at least determine the direction (in FIG. 1 and FIG. 2 denoted D) of the second radio transceiver device 120 with respect to the first radio transceiver device 110. Further details of this as well as other aspects of the processing unit 200 will be disclosed below.

FIG. 1 represents a scenario where the first radio transceiver device 110 has a transmitter (TX) and is configured to transmit signals in beams B1, B2, B3, B4, B5 in a beam set (as given by antenna radiation patterns), either sequentially in time or simultaneously. The second radio transceiver device 120 has a receiver (RX) and is configured to perform measurements, for example in terms of power values, on these signals. The second radio transceiver device 120 is further configured to provide the measurements to the processing unit 200.

FIG. 2 represents a scenario where the second radio transceiver device 120 has a transmitter (TX) and is configured to transmit a signal. The first radio transceiver device 110 has a receiver (RX) and is configured to perform measurements, for example in terms of power values, on this signal in beams B1, B2, B3, B4, B5 in a beam set (as given by antenna radiation patterns), either sequentially in time or simultaneously. The first radio transceiver device 110 is further configured to provide the measurements to the processing unit 200.

Information, for example in terms of a profile table, with direction profiles and associated data for the first radio transceiver device 110 is made available. Table 1 shows an example of such a profile table. Each direction profile corresponds to measurements in a specific direction D relative the first radio transceiver device 110. Each direction profile is given by a unique vector of e.g. relative power values for the used beams B1, B2, . . . , BM (where M is the total number of beams in the beam set) and is associated with a unique index F1, F2, . . . for a given direction. Associated data can be, e.g. the directivity of a beam set in the given direction or the directivity of an auxiliary beam, such as a beam in which a cell-covering reference signal is transmitted. The profile table is delivered with the first radio transceiver device 110 and can be downloaded on requested to the processing unit 200.

TABLE 1

Example profile table. Each row has a unique direction profile and an identifier, as given by the profile index. Each direction profile is associated with a direction, e.g. via the two angles theta and phi, and can also comprise columns for auxiliary data (Aux A, Aux B, . . . ).

| Profile index | Direction profile | Theta | Phi | Aux A | Aux B | . . . |
|---|---|---|---|---|---|---|
| F1 | $[x_{B1}\ x_{B2} \ldots x_{BM}]_{F1}$ | $\theta_{F1}$ | $\phi_{F1}$ | $A_{F1}$ | $B_{F1}$ | . . . |
| F2 | $[x_{B1}\ x_{B2} \ldots x_{BM}]_{F2}$ | $\theta_{F2}$ | $\phi_{F2}$ | $A_{F2}$ | $B_{F2}$ | . . . |
| . | . | . | . | . | . | . |
| . | . | . | . | . | . | |
| . | . | . | . | . | . | |

The profile table (or equivalent data items) might be held by the first radio transceiver device 110 and is made available to the processing unit 200. Hence, in some aspects, the profile table is signaled from the first radio transceiver device 110 to the processing unit 200, possible via another network entity. The profile table, or equivalent data items, might be signaled over the user plane or the control plane, depending on implementation. The processing unit 200 can, when required, download, or otherwise access, the profile table from the first radio transceiver device 110.

FIG. 3 is a flowchart illustrating embodiments of methods for determining direction of a second radio transceiver device 120 with respect to a first radio transceiver device 110. The first radio transceiver device 110 is configured to communicate with beams in a beam set. The methods are performed by the processing unit 200. The methods are advantageously provided as computer programs 1220.

S102: The processing unit 200 obtains a vector of radio parameter measurements from measurements performed on a radio link between the first radio transceiver device 110 and the second radio transceiver device 120 for one and the same location of the second radio transceiver device 120. The vector comprises a radio parameter measurement per each beam in the beam set.

S104: The processing unit 200 determines the direction D of the second radio transceiver device 120 with respect to the first radio transceiver device 110 by comparing the vector of radio parameter measurements to a set of candidate direction profiles.

Candidate direction profiles can be used to determine the direction D of the second radio transceiver device 120 with respect to the first radio transceiver device 110. The candidate direction profiles are selected in such a way that in each direction relative to the first radio transceiver device 110, the second radio transceiver device 120 can measure a unique power, or amplitude and phase, profile over the group of beams.

Each candidate direction profile represents one candidate direction D of the second radio transceiver device 120 with respect to the first radio transceiver device 110.

Each candidate direction profile comprises a radio parameter estimate per each beam in the beam set.

The direction D of the second radio transceiver device 120 with respect to the first radio transceiver device 110 is given by the candidate direction of the candidate direction profile that, according to a similarity measure, is most similar to the vector of radio parameter measurements.

For example, the vector of radio parameter measurements might be compared to candidate direction profiles in a table, yielding an index that represents the closest match. The index thus indicates the direction D of the second radio transceiver device 120 with respect to the first radio transceiver device 110.

According to this method the relative direction D of the second radio transceiver device 120 with respect to the first radio transceiver device 110 can be obtained accurately without the need for physical access to the first radio transceiver device 110 or disruption of the live network operation of the first radio transceiver device 110.

Embodiments relating to further details of determining direction of a second radio transceiver device 120 with respect to a first radio transceiver device 110 as performed by the processing unit 200 will now be disclosed.

Without loss of generality, in some of the below examples it will be assumed that the first radio transceiver device 110 transmits signals in a beam set and that the second radio transceiver device 120 performs measurements on these signals. Thus, in some embodiments, the measurements represent measurements performed by the second radio transceiver device 120 on signals transmitted by the first radio transceiver device 110 in the beam set. However, it can equally be that that it is the second radio transceiver that transmits the signals and that the first radio transceiver device 110 receives the signals in the beam set. Thus, in other embodiments, the measurements represent measurements performed by the first radio transceiver device 110 on signals received in the beams and transmitted by the second radio transceiver device 120.

In some embodiments, the radio parameter estimates are either precalculated values or previously obtained measurements.

In some non-limiting examples, the radio parameter measurements pertain to at least one of: power values, amplitude and phase values. In further non-limiting examples, the radio parameter measurements could be: power values per beam, amplitude and/or phase values per beam, power values per beam and polarization, amplitude and/or phase values per beam and polarization. In yet further non-limiting examples, the radio parameter measurements pertain also to any of: time, frequency, coding.

There might be different examples of similarity measures. In some non-limiting examples, the similarity measure pertains to one of: correlation between the vector of radio parameter measurements and each of the candidate direction profiles, a norm between the vector of radio parameter measurements and each of the candidate direction profiles.

As a first non-limiting example, from the vector of radio parameter measurements $\vec{F}_{meas}$, the candidate direction profiles $\vec{F}_n$, where n=1 . . . N and N is the total number of candidate direction profiles, the correlation between $\vec{F}_{meas}$ and $\vec{F}_n$ can e.g. be calculated as:

$$\rho_n = \frac{\vec{F}_{meas} \cdot \vec{F}_n}{|\vec{F}_{meas}|}$$

Here, $\vec{F}_n$ is the candidate direction profile with profile index n and given in linear scale. Furthermore, the candidate direction profiles can be normalized as:

$$\vec{F}_n \cdot \vec{F}_n = 1$$

If the processing unit 200 is capable of handling complex measurements (amplitude and phase values) the candidate direction profiles can be complex-valued and the correlation can then be calculated as $$\rho_n = \vec{F}^*_{meas} \cdot \vec{F}_n$$

Here, the symbol * denotes complex conjugation. In this case, the candidate direction profiles can always be made orthogonal which could improve the usefulness of the correlation.

As a second non-limiting example, the best matching candidate direction profile can be found by formulating a numerical minimization problem using a suitable norm for the deviation from the vector of radio parameter measurements to any direction profile in the profile table. Such a norm could be:

$$\|\overrightarrow{FPV} - \overrightarrow{FP}_{Fi}\| = (\Sigma |FPV_{Bi} - FP_{Bi,Fj}|^2)^{1/2}$$

Here, in the case of power only direction profile, $FPV_{Bi}$ is the measured power level of beam Bi in the vector of radio parameter measurements and $FP_{Bi,Fj}$ is the pre-calculated power level of direction profile $F_j$ for beam Bi. The matching profile index can then be found by minimizing.

$$\|\overrightarrow{FPV} - \overrightarrow{FP}_{Fi}\|$$

Here $\overrightarrow{FP}_{Fi}$ is a candidate direction profile in the profile table with profile index Fi.

Correlation or norm data can also be used to find intermediate directions between the ones provided in the profile table, by using proper interpolation techniques.

The similarity measure can be used as a figure of merit of measurement accuracy. In some aspects, not only the direction is determined, but also a measure of the accuracy of the thus determined direction is estimated. The measure of the accuracy can be represented by a quality level. Particularly, in some embodiments the processing unit 200 is configured to perform (optional) step S106:

S106: The processing unit 200 estimates a quality level of the determined direction D of the second radio transceiver device 120 with respect to the first radio transceiver device 110 when comparing the vector of radio parameter measurements to the set of candidate direction profiles.

There could be different examples of parameters to which the quality level relates. In some embodiments, the quality level pertains to any of: a line of sight condition of the second radio transceiver device 120 with respect to the first radio transceiver device 110, a service region condition of the second radio transceiver device 120 with respect to the first radio transceiver device 110, an operational condition of the first radio transceiver device 110. For example, the line of sight condition could be fulfilled when the second radio transceiver device 120 is in line of sight with respect to the first radio transceiver device 110. Alternatively, for a multipath radio propagation channel, the line of sight condition could be fulfilled when the communication between the second radio transceiver device 120 and the first radio transceiver device 110 is dominated by a line of sight component of the multipath radio propagation channel. For example, the service region condition could be fulfilled when the second radio transceiver device 120 is within the service region of the first radio transceiver device 110. For example, the operational condition could be fulfilled when the first radio transceiver device 110 is operating normally.

In some aspects, any of these conditions is fulfilled when there is one distinct high similarity value (either absolute or relative). In particular, in some embodiments, any of the line of sight condition, the service region condition, and the operational condition is fulfilled when one of the candidate direction profiles has a value of the similarity measure that is at least one of: higher than a predetermined threshold value, more than a predetermined factor higher than the value of the similarity measure for any other candidate direction profile.

The estimated quality level could thus give an indication of lack of line-of-sight conditions or too severe multi-path conditions. Based on the threshold values set for the quality level, the final measurement uncertainty of the direction as determined in step S104 can be adopted to the needs of the actual use case. This information can also be used to issue a warning about bad testing directions. A bad match (as indicated by a low value of the quality level) can also be caused by poor alignment between the measurement antenna towards the direction of propagation, sidelobe reception with low signal to noise ratio (SNR). When one or more of the conditions are not fulfilled this thus gives an indication that the accuracy of the determined direction is low. In some aspects, this triggers a warning to be issued. Hence, in some embodiments the processing unit 200 is configured to perform (optional) step S108:

S108: The processing unit 200 issues a warning signal when at least one of the line of sight condition, the service region condition, and the operational condition is not fulfilled.

Feedback of the thus estimated quality level could help the tester to better align the second radio transceiver device 120 with respect to the first radio transceiver device 110, thus yielding higher SNR and lower measurement uncertainty.

By reporting the estimated quality level of the best match, assuming that the candidate direction profiles represent directions inside the service region only, it can be detected whether the measurement position corresponds to an angular direction within the service region and in line-of-sight.

Upon having determined the direction D of the second radio transceiver device 120 with respect to the first radio transceiver device 110, the processing unit 200 might estimate one or more radio performance parameters. In particular, some embodiments the processing unit 200 is configured to perform (optional) step S106:

S110: The processing unit 200 estimates, using the vector of radio parameter measurements and the determined direction D of the second radio transceiver device 120 with respect to the first radio transceiver device 110, at least one of: TRP of the first radio transceiver device 110, amount of resource elements (REs) used by the first radio transceiver device 110, EIRP of the first radio transceiver device 110.

In some aspects, step S110 is only performed upon the processing unit 200 having verified that the quality level as estimated in step S106 is above a threshold value.

From knowledge of the profile index, associated data such as direction (theta, phi), directivity of dedicated beams of the first radio transceiver device 110 in the direction D of the second radio transceiver device 120 can be determined. For example, from this knowledge, and the distance r between the first radio transceiver device 110 and the second radio transceiver device 120, and measured power density p, the TRP of the dedicated beam can be calculated as:

$$TRP = \frac{p}{4\pi r^2 D(\theta, \phi)}$$

The used beam (for the measured power density p and the directivity towards the second radio transceiver device 120) for the TRP calculation can be different. It can be a dedicated test pattern a sequence of patterns, or the pattern of the first radio transceiver device 110 as used in live operation.

In some aspects, the processing unit 200 provide information of the determined direction and/or TRP, etc. to an operations, administration and maintenance (OAM) entity in the communication network. That is in some embodiments the processing unit 200 is configured to perform (optional) step S112:

S112: The processing unit 200 provides, to an OAM entity of the first radio transceiver device 110, information of the determined direction D of the second radio transceiver device 120 with respect to the first radio transceiver device 110, the estimated TRP, amount of REs used by the first radio transceiver device 110, and/or EIRP of the first radio transceiver device 110 only when the quality level is above a predetermined threshold value.

The OAM entity can then take the provided information as input for example when determining whether or not the first radio transceiver device 110 is in need of calibration or when determining whether or not the first radio transceiver device 110 fulfils regulatory requirements. The provided information can thereby be used by mobile network operators to optimize and calibrate base station power consumption, coverage and interference.

In some embodiments, each of the candidate direction profiles comprises auxiliary data (as in Table 1 illustrated as "Aux 1" and "Aux 2"). The direction D of the second radio transceiver device 120 with respect to the first radio transceiver device 110 further might then be determined using the auxiliary data. For example, the direction D of the second radio transceiver device 120 with respect to the first radio transceiver device 110 might be determined by comparing the auxiliary data to auxiliary measurements performed on the radio link between the first radio transceiver device 110 and the second radio transceiver device 120 for the one and the same location of the second radio transceiver device 120.

In some aspects, the profile indices are associated to a MIMO transmission codebook index, for example as defined in document 3GPP TS 38.211 entitled "NR; Physical channels and modulation", version 16.1.0. For a calibrated first radio transceiver device 110, where the phase relation between the transmitter branches are characterized, the codebook could be extended to also include information captured by the profile table. In particular, in some embodiments, the first radio transceiver device 110 is configured to communicate in accordance with a MIMO transmission codebook, and information of the candidate direction profiles is comprised in the MIMO transmission codebook. Hence, the processing unit 200 can identify the codebook index to request profile table data.

For Frequency Range 1 (FR1) or frequencies below 7 GHz, where reciprocity-based or codebook-based beam-forming is used for data transmission, and where a grid of beams is used for broadcast, the beams used for broadcast are suitable for the second radio transceiver device 120 to perform measurements on. The candidate direction profiles are then built up from power values of the beams for broadcast. But also beams carrying data can be used if the information of the beam directions is provided to the processing unit 200. The candidate direction profiles are then also built up from power values of the beams carrying data.

For Frequency Range 1 (FR1) or frequencies above 7 GHz, where typically analog beam forming architectures is used, measurements can be performed on signals for both data and broadcast. The candidate direction profiles are then built up from power values of the beams for broadcast and the beams carrying data.

Simulation results for two illustrative examples will be disclosed next with references to FIG. 4, FIG. 5, FIG. 6, FIG. 7, and FIG. 8.

Figure 4:
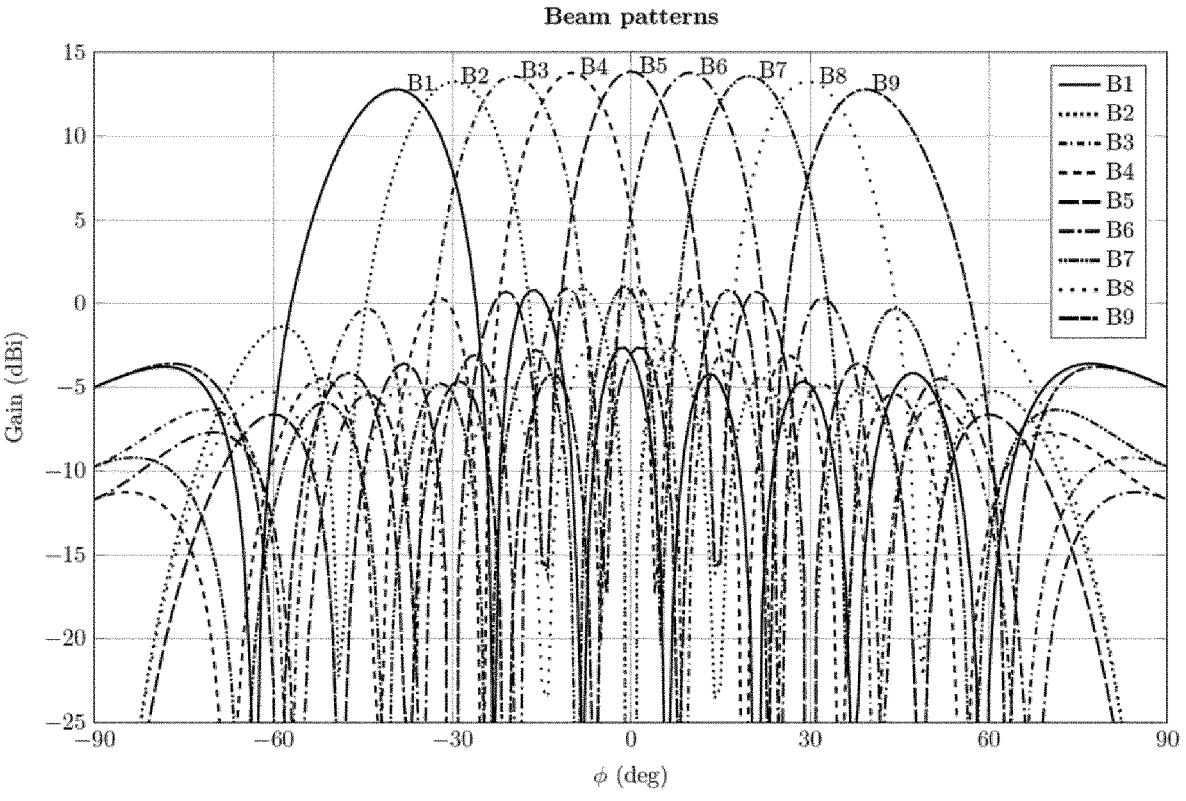
FIGS. 4 to 9 show simulation results according to embodiments.

In a first illustrative example it is assumed that the first radio transceiver device 110 is configured to transmit in nine beams B1, B2, . . . , B9 and that 51 pre-calculated candidate direction profiles F1, F2, . . . , F51 are used corresponding to the directions −50°, −48°, . . . , 50°. The beam pointing directions are all in the horizontal plane, i.e., $\theta = 90°$ and the beam peak directions cover −40 to +40 degrees in $\phi$. FIG. 4 shows the radiation pattern (in terms of power profiles versus angle) of the nine beams B1, B2, . . . , B9.

Table 2 shows the profile indices of the first five beams B1, B2, . . . , B5 of FIG. 4. Five beams, as represented by their power values P_B1, P_B2, . . . , P_B5 for each profile index, are used together with directional data, phi, and auxiliary data in the form of directivity data for a beam utilized for transmission of reference signals to define each candidate direction profile. In this illustrative example the direction, as given by phi, of each profile index is stored together with the maximum directivity of the five dedicated beams as well as the directivity of a wide beam used for transmission of reference signals.

TABLE 2

An example profile table showing values for power profile indices F20-23.

| Profile index | P_B1 | P_B2 | P_B3 | P_B4 | P_B5 | Phi | Directivity of ref. signal beam |
|---|---|---|---|---|---|---|---|
| . | . | . | . | . | . | . | . |
| . | . | . | . | . | . | . | . |
| . | . | . | . | . | . | . | . |
| F20 | 0.014 | 0.014 | 0.243 | 0.648 | 0.027 | −12 | 14.67 |
| F21 | 0.003 | 0.03 | 0.117 | 0.697 | 0.101 | −10 | 14.77 |
| F22 | 0 | 0.037 | 0.035 | 0.66 | 0.226 | −8 | 14.85 |
| F23 | 0.004 | 0.03 | 0.002 | 0.546 | 0.385 | −6 | 14.92 |
| . | . | . | . | . | . | . | . |
| . | . | . | . | . | . | . | . |

Figure 5:
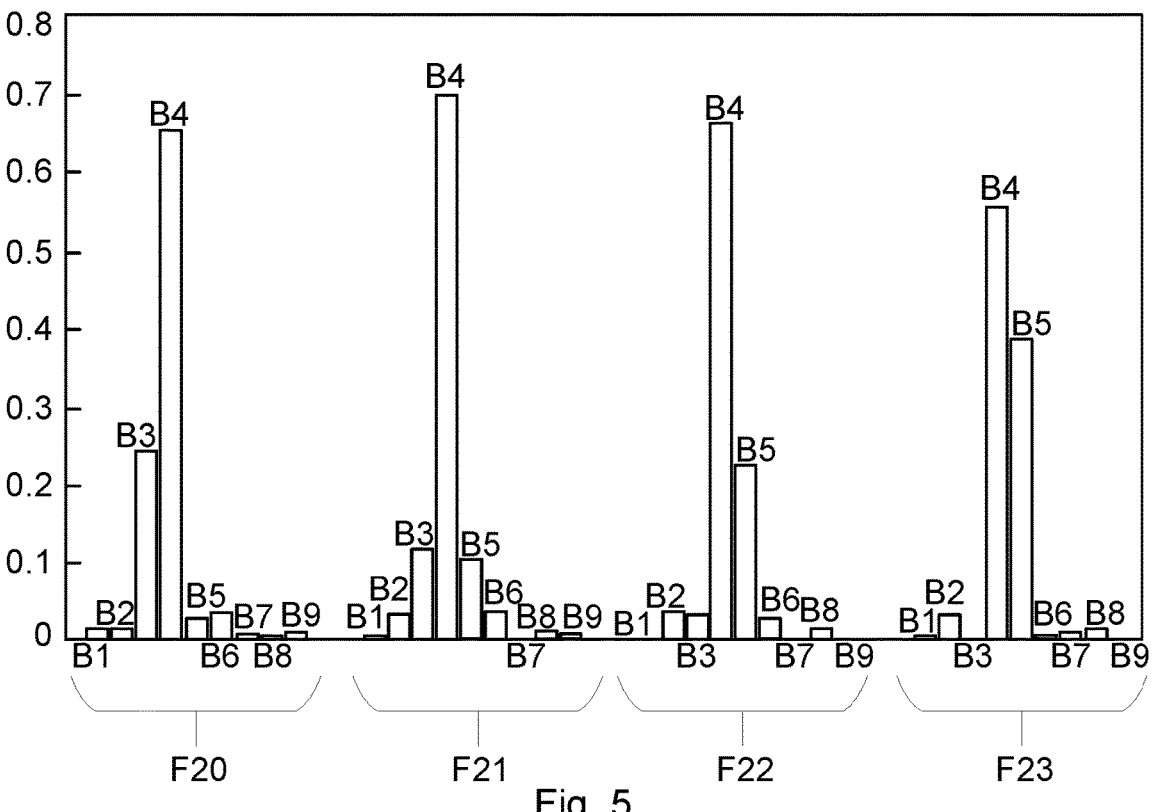

FIG. 5 shows, as a bar chart, the values of the candidate direction profiles of the same power profiles F20-F23. It can be noted that B4 is the strongest beam (i.e., P_B4 is highest of all the power values) and that the balance between B3 and B5 in F21 indicates that F21 is taken close to the beam pointing direction of beam B4.

Figure 6:
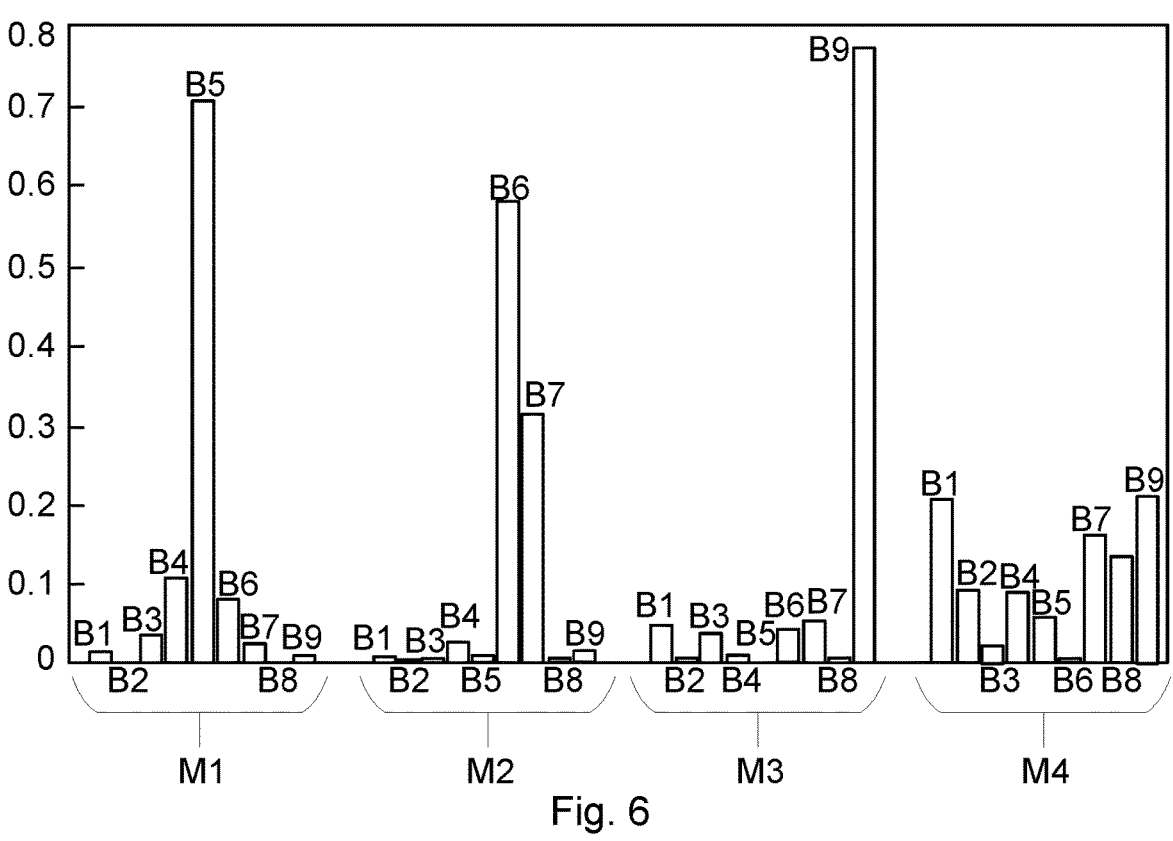

FIG. 6 shows, as a bar chart, the performance for four measurement directions in the presence of white noise corresponding to SNR=20 dB for the first illustrative example. The measurement directions, resulting candidate direction profile matches and errors are presented in Table 3. Note that the measurement with measurement ID M4 is out of the range (−50,50) of the pre-calculated candidate direction profile and comparing with the radiation patterns of FIG. 4 it is evident that this direction is outside the coverage region of the nine beams. This manifests as a significant increase in the matching error, which serves as an example of the capability of out-of-service-area detection. Similar results also occur in non-line-of-sight conditions.

TABLE 3

List of matching results.

| Measure-ment ID | Measure-ment angle | Profile index of best match | Associated angle phi | Matching Error (%) |
|---|---|---|---|---|
| M1 | 0 | 26 | 0 | 0.07 |
| M2 | 13 | 33 | 14 | 0.85 |
| M3 | 50 | 51 | 50 | 0.13 |
| M4 | 70 | 43 | 34 | 26.68 |

In a second illustrative example, it is assumed that the first radio transceiver device 110 is configured to transmit in a 3-by-5 grid of beams.

Figure 7:
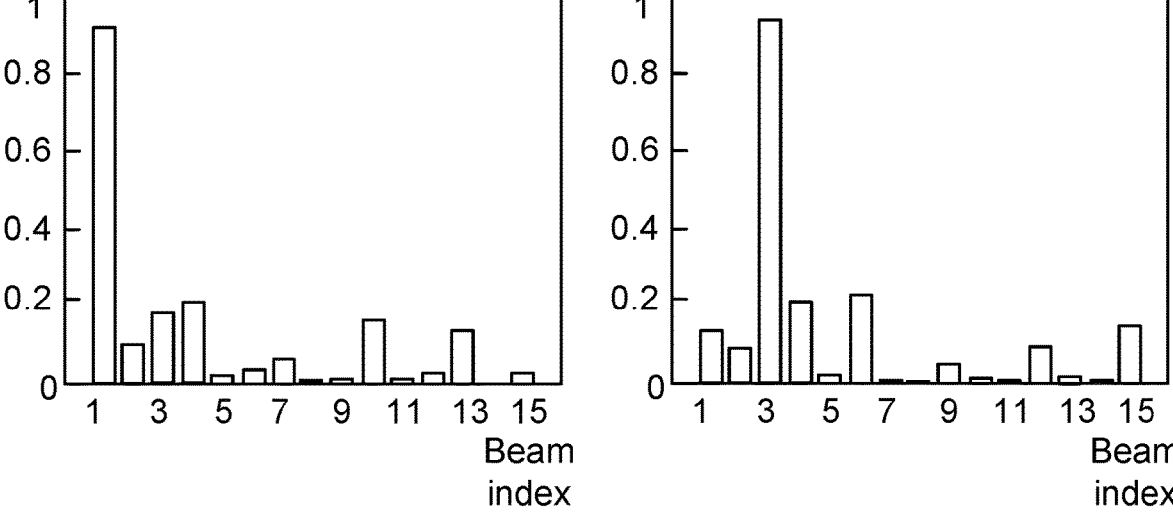

FIG. 7 shows, as a bar plot, the values of two of the candidate direction profiles of the second example.

Figure 8:
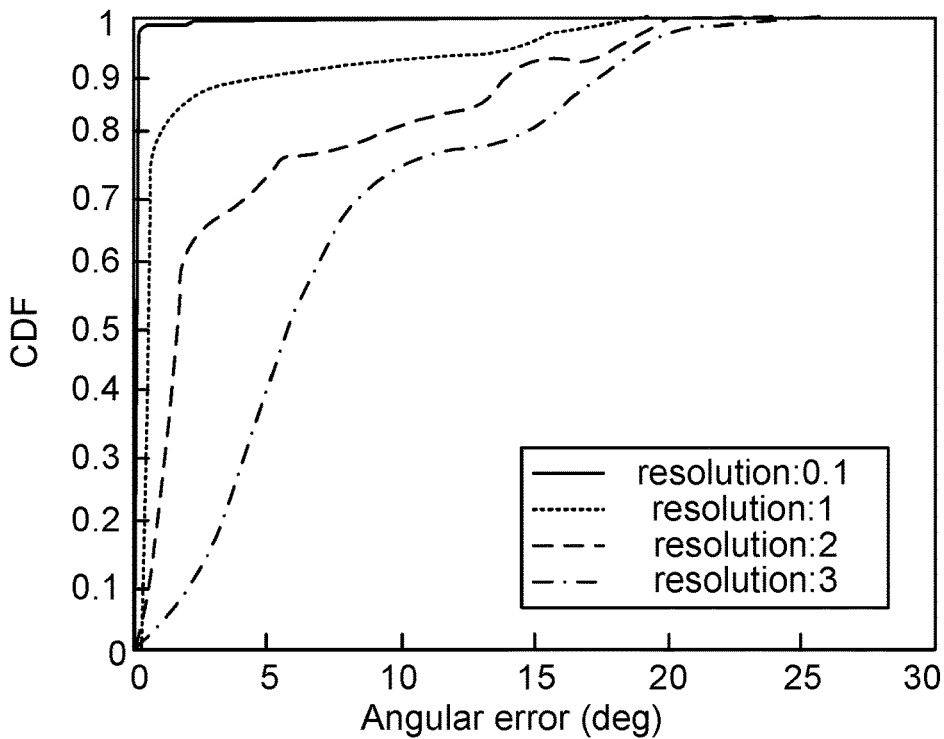

FIG. 8 shows the cumulative distribution function (CDF) of the angular error for different resolutions of the candidate direction profiles in the profile table of the second example. Here, a simple inner product is used to find the matching candidate direction profile in the profile table. It is observed that the angular error can be quite large for a sparse profile table. However, the angular error is not necessarily a relevant performance indicator. If the objective is to estimate TRP, the error in the directivity estimate would be a better performance indicator.

Figure 9:
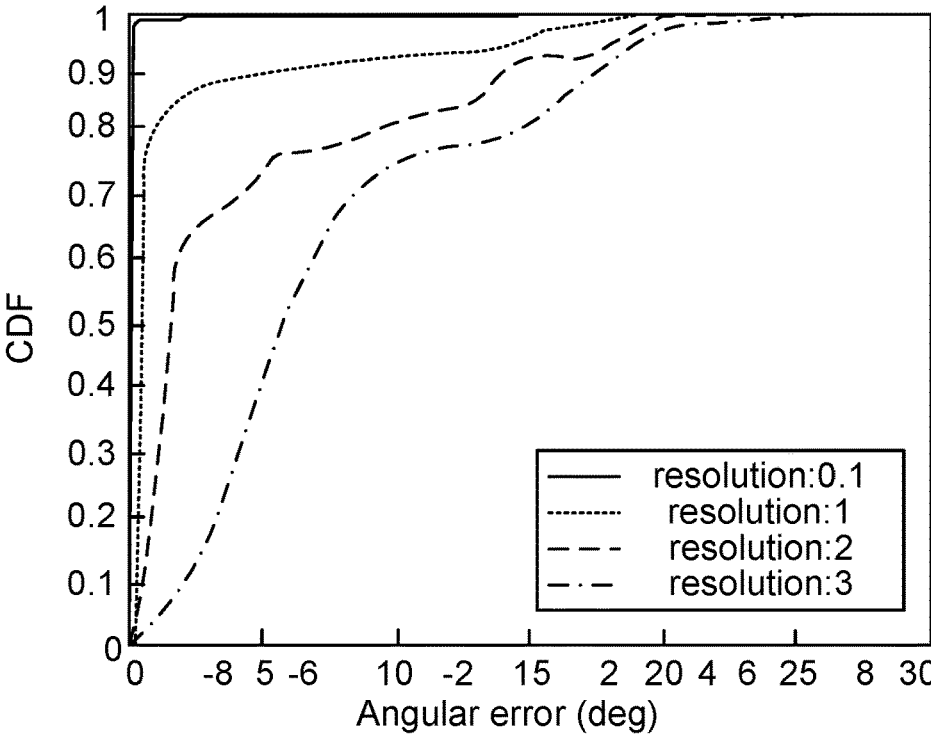

The error in the directivity of a wide beam is shown in FIG. 9. assuming that after the direction determining as in step S104, the wide beam is generated by the first radio transceiver device 110 for the purpose of final TRP estimation. Even with very sparse profile table, the error can be within a few decibel (dB) most of the time. This is an advantage for in-the-field TRP measurements since this accuracy can be achieved with measurements only at a single point, eliminating the need to move around the second radio transceiver device 120 for making multiple measurements. Moreover, the results shown correspond to nearest neighbor interpolation, which is not optimal. Furthermore, only one data point is used here. Use of more data points and suitable interpolation techniques might improve the results.

Figure 10:
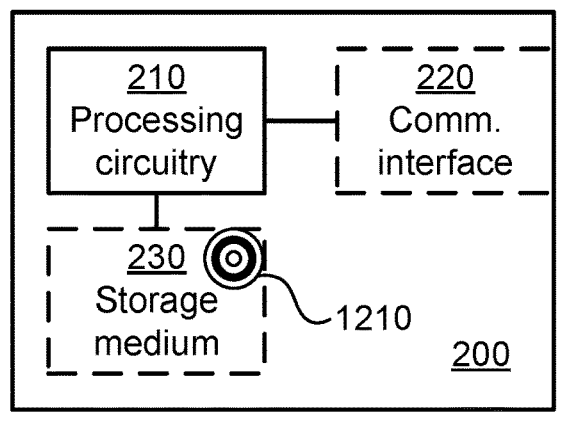
FIG. 10 is a schematic diagram showing functional units of a processing unit according to an embodiment.

FIG. 10 schematically illustrates, in terms of a number of functional units, the components of a processing unit 200 according to an embodiment. Processing circuitry 210 is provided using any combination of one or more of a suitable central processing unit (CPU), multiprocessor, microcontroller, digital signal processor (DSP), etc., capable of executing software instructions stored in a computer program product 1210 (as in FIG. 12), e.g. in the form of a storage medium 230. The processing circuitry 210 may further be provided as at least one application specific integrated circuit (ASIC), or field programmable gate array (FPGA).

Particularly, the processing circuitry 210 is configured to cause the processing unit 200 to perform a set of operations, or steps, as disclosed above. For example, the storage medium 230 may store the set of operations, and the processing circuitry 210 may be configured to retrieve the set of operations from the storage medium 230 to cause the processing unit 200 to perform the set of operations. The set of operations may be provided as a set of executable instructions.

Thus the processing circuitry 210 is thereby arranged to execute methods as herein disclosed. The storage medium 230 may also comprise persistent storage, which, for example, can be any single one or combination of magnetic memory, optical memory, solid state memory or even remotely mounted memory. The processing unit 200 may further comprise a communications interface 220 at least configured for communications with other entities of the communication network 100, such as the first radio transceiver device 110, the second radio transceiver device 120, and an OAM entity. As such the communications interface 220 may comprise one or more transmitters and receivers, comprising analogue and digital components. The processing circuitry 210 controls the general operation of the processing unit 200 e.g. by sending data and control signals to the communications interface 220 and the storage medium 230, by receiving data and reports from the communications interface 220, and by retrieving data and instructions from the storage medium 230. Other components, as well as the related functionality, of the processing unit 200 are omitted in order not to obscure the concepts presented herein.

Figure 11:
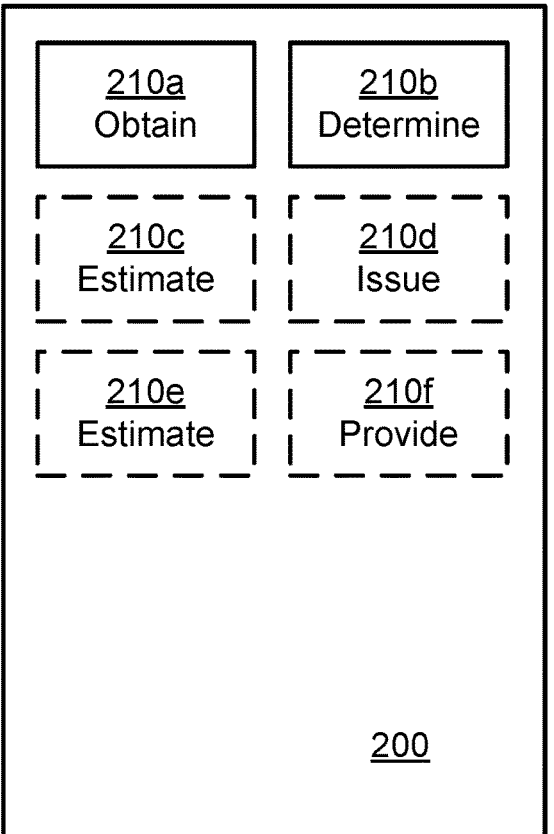
FIG. 11 is a schematic diagram showing functional modules of a processing unit according to an embodiment.

FIG. 11 schematically illustrates, in terms of a number of functional modules, the components of a processing unit 200 according to an embodiment. The processing unit 200 of FIG. 11 comprises a number of functional modules; an obtain module 210a configured to perform step S102, and a determine module 210b configured to perform step S104. The processing unit 200 of FIG. 11 may further comprise a number of optional functional modules, such as any of an estimate module 210c configured to perform step S106, an issue module 210d configured to perform step S108, an estimate module 210e configured to perform step S110, and a provide module 210f configured to perform step S112. In general terms, each functional module 210a-210f may in one embodiment be implemented only in hardware and in another embodiment with the help of software, i.e., the latter embodiment having computer program instructions stored on the storage medium 230 which when run on the processing circuitry makes the processing unit 200 perform the corresponding steps mentioned above in conjunction with FIG. 11. It should also be mentioned that even though the modules correspond to parts of a computer program, they do not need to be separate modules therein, but the way in which they are implemented in software is dependent on the programming language used. Preferably, one or more or all functional modules 210a-210f may be implemented by the processing circuitry 210, possibly in cooperation with the communications interface 220 and/or the storage medium 230. The processing circuitry 210 may thus be configured to from the storage medium 230 fetch instructions as provided by a functional module 210a-210f and to execute these instructions, thereby performing any steps as disclosed herein.

The processing unit 200 may be provided as a standalone device or as a part of at least one further device. For example, the processing unit 200 may be provided in a node of the radio access network or in a node of the core network. As disclosed above, the processing unit 200 may be provided in the first radio transceiver device 110, in the second radio transceiver device 120, or in a network controller. Alternatively, functionality of the processing unit 200 may be distributed between at least two devices, or nodes. These at least two nodes, or devices, may either be part of the same network part (such as the radio access network or the core network) or may be spread between at least two such network parts. In general terms, instructions that are required to be performed in real time may be performed in a device, or node, operatively closer to the cell than instructions that are not required to be performed in real time.

Thus, a first portion of the instructions performed by the processing unit 200 may be executed in a first device, and a second portion of the of the instructions performed by the processing unit 200 may be executed in a second device; the herein disclosed embodiments are not limited to any particular number of devices on which the instructions performed by the processing unit 200 may be executed. Hence, the methods according to the herein disclosed embodiments are suitable to be performed by a processing unit 200 residing in a cloud computational environment. Therefore, although a single processing circuitry 210 is illustrated in FIG. 10 the processing circuitry 210 may be distributed among a plurality of devices, or nodes. The same applies to the functional modules 210a-210f of FIG. 11 and the computer program 1220 of FIG. 12.

Figure 12:
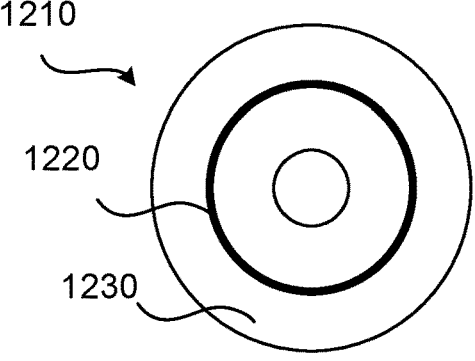
FIG. 12 shows one example of a computer program product comprising computer readable storage medium according to an embodiment.

FIG. 12 shows one example of a computer program product 1210 comprising computer readable storage medium 1230. On this computer readable storage medium 1230, a computer program 1220 can be stored, which computer program 1220 can cause the processing circuitry 210 and thereto operatively coupled entities and devices, such as the communications interface 220 and the storage medium 230, to execute methods according to embodiments described herein. The computer program 1220 and/or computer program product 1210 may thus provide means for performing any steps as herein disclosed.

In the example of FIG. 12, the computer program product 1210 is illustrated as an optical disc, such as a CD (compact disc) or a DVD (digital versatile disc) or a Blu-Ray disc. The computer program product 1210 could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program 1220 is here schematically shown as a track on the depicted optical disk, the computer program 1220 can be stored in any way which is suitable for the computer program product 1210.

Figure 13:
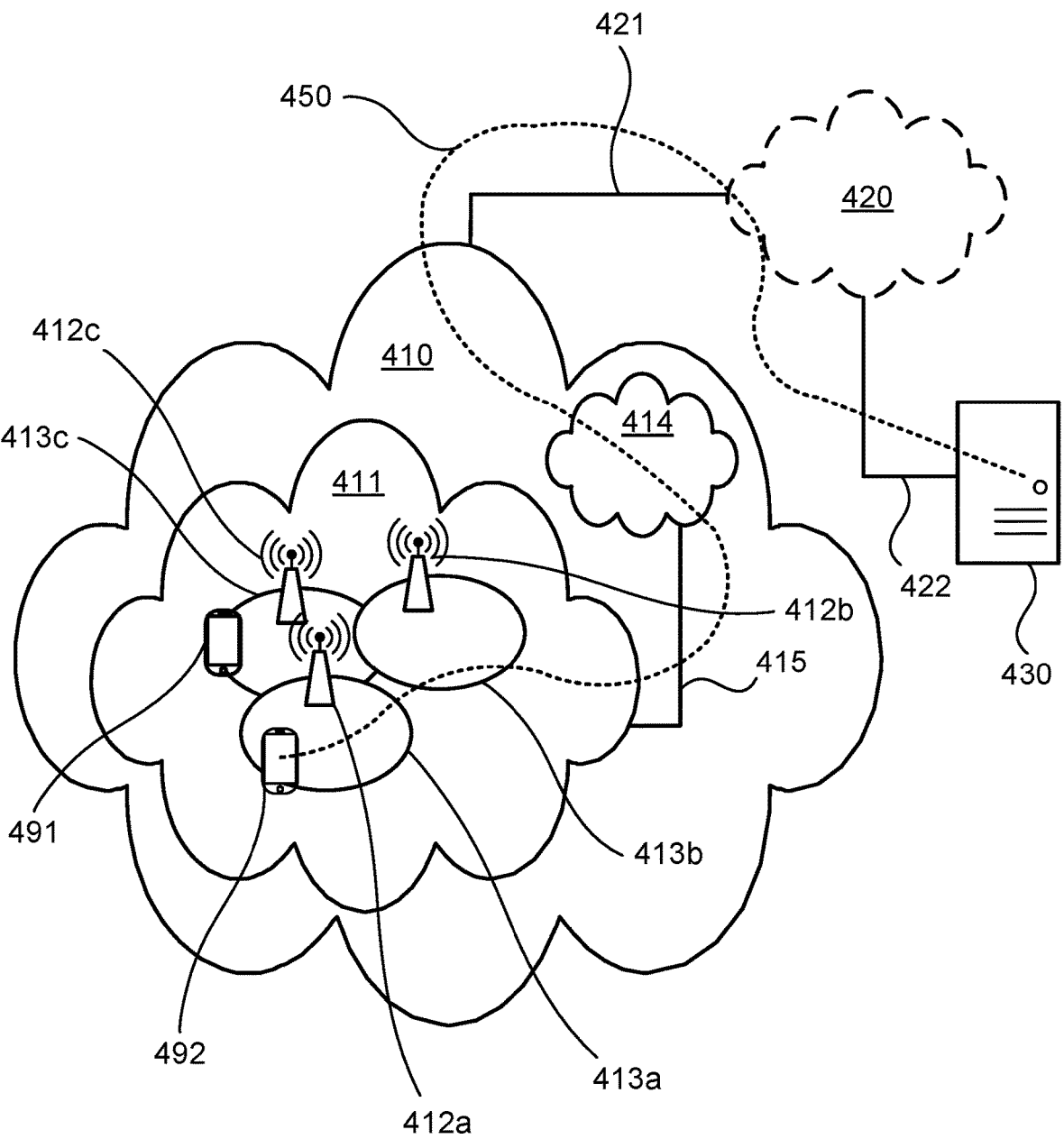
FIG. 13 is a schematic diagram illustrating a telecommunication network connected via an intermediate network to a host computer in accordance with some embodiments.

FIG. 13 is a schematic diagram illustrating a telecommunication network connected via an intermediate network 420 to a host computer 430 in accordance with some embodiments. In accordance with an embodiment, a communication system includes telecommunication network 410, such as a 3GPP-type cellular network, which comprises access network 411, and core network 414. Access network 411 comprises a plurality of radio access network nodes 412a, 412b, 412c, such as NBs, eNBs, gNBs (each corresponding to the first radio transceiver device 110 of FIG. 1 and FIG. 2) or other types of wireless access points, each defining a corresponding coverage area, or cell, 413a, 413b, 413c. Each radio access network nodes 412a, 412b, 412c is connectable to core network 414 over a wired or wireless connection 415. A first UE 491 located in coverage area 413c is configured to wirelessly connect to, or be paged by, the corresponding network node 412c. A second UE 492 in coverage area 413a is wirelessly connectable to the corresponding network node 412a. While a plurality of UE 491, 492 are illustrated in this example, the disclosed embodiments are equally applicable to a situation where a sole UE is in the coverage area or where a sole terminal device is connecting to the corresponding network node 412. The UEs 491, 492 correspond to the second radio transceiver device 120 of FIG. 1 and FIG. 2.

Telecommunication network 410 is itself connected to host computer 430, which may be embodied in the hardware and/or software of a standalone server, a cloud-implemented server, a distributed server or as processing resources in a server farm. Host computer 430 may be under the ownership or control of a service provider, or may be operated by the service provider or on behalf of the service provider. Connections 421 and 422 between telecommunication network 410 and host computer 430 may extend directly from core network 414 to host computer 430 or may go via an optional intermediate network 420. Intermediate network 420 may be one of, or a combination of more than one of, a public, private or hosted network; intermediate network 420, if any, may be a backbone network or the Internet; in particular, intermediate network 420 may comprise two or more subnetworks (not shown).

The communication system of FIG. 13 as a whole enables connectivity between the connected UEs 491, 492 and host computer 430. The connectivity may be described as an over-the-top (OTT) connection 450. Host computer 430 and the connected UEs 491, 492 are configured to communicate data and/or signaling via OTT connection 450, using access network 411, core network 414, any intermediate network 420 and possible further infrastructure (not shown) as intermediaries. OTT connection 450 may be transparent in the sense that the participating communication devices through which OTT connection 450 passes are unaware of routing of uplink and downlink communications. For example, network node 412 may not or need not be informed about the past routing of an incoming downlink communication with data originating from host computer 430 to be forwarded (e.g., handed over) to a connected UE 491. Similarly, network node 412 need not be aware of the future routing of an outgoing uplink communication originating from the UE 491 towards the host computer 430.

Figure 14:
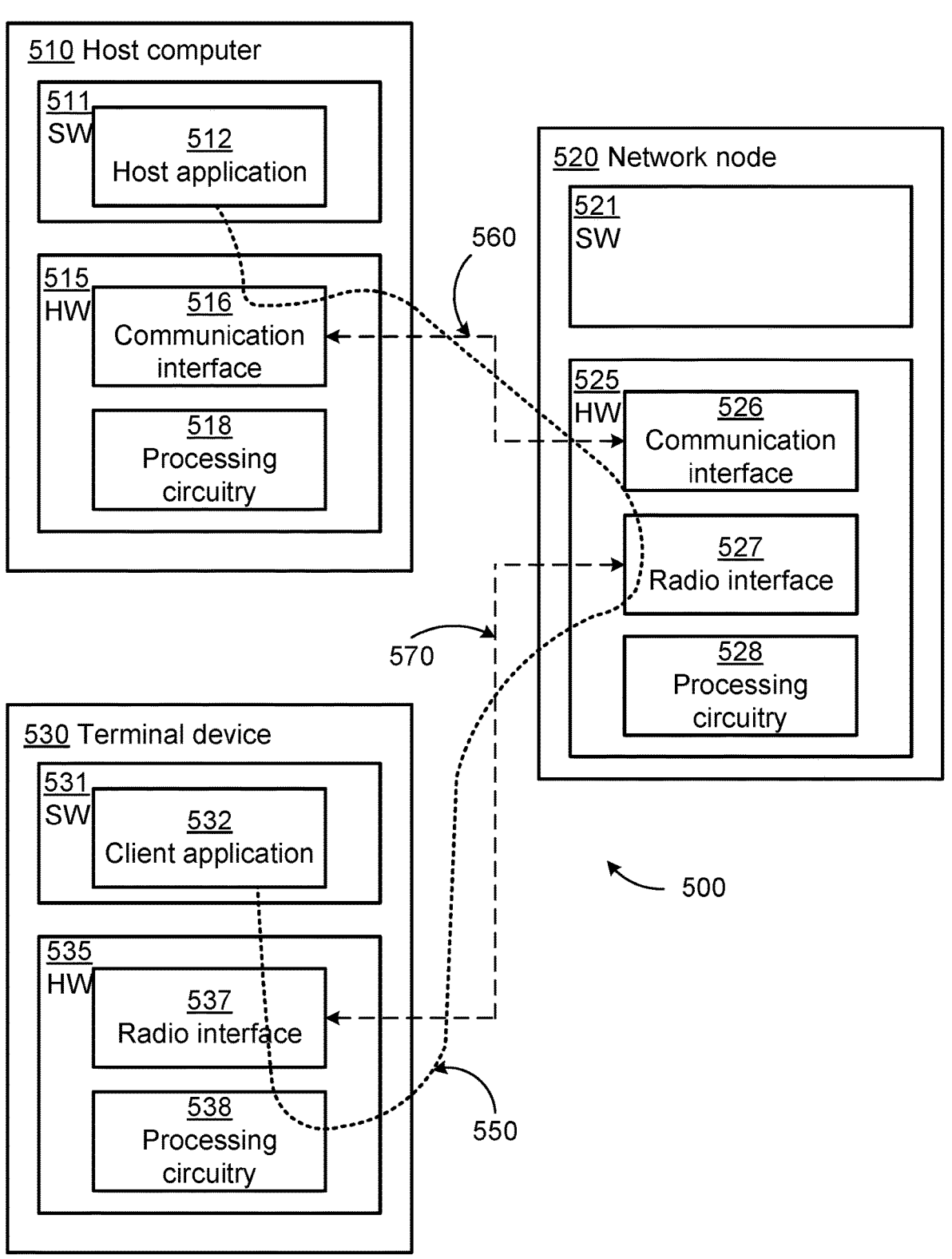
FIG. 14 is a schematic diagram illustrating host computer communicating via a radio base station with a terminal device over a partially wireless connection in accordance with some embodiments.

FIG. 14 is a schematic diagram illustrating host computer communicating via a radio access network node with a UE over a partially wireless connection in accordance with some embodiments. Example implementations, in accordance with an embodiment, of the UE, radio access network node and host computer discussed in the preceding paragraphs will now be described with reference to FIG. 14. In communication system 500, host computer 510 comprises hardware 515 including communication interface 516 configured to set up and maintain a wired or wireless connection with an interface of a different communication device of communication system 500. Host computer 510 further comprises processing circuitry 518, which may have storage and/or processing capabilities. In particular, processing circuitry 518 may comprise one or more programmable processors, application-specific integrated circuits, field programmable gate arrays or combinations of these (not shown) adapted to execute instructions. Host computer 510 further comprises software 511, which is stored in or accessible by host computer 510 and executable by processing circuitry 518. Software 511 includes host application 512. Host application 512 may be operable to provide a service to a remote user, such as UE 530 connecting via OTT connection 550 terminating at UE 530 and host computer 510. The UE 530 corresponds to the second radio transceiver device 120s of FIG. 1 and FIG. 2. In providing the service to the remote user, host application 512 may provide user data which is transmitted using OTT connection 550.

Communication system 500 further includes radio access network node 520 provided in a telecommunication system and comprising hardware 525 enabling it to communicate with host computer 510 and with UE 530. The radio access network node 520 corresponds to the first radio transceiver device 110 of FIG. 1 and FIG. 2. Hardware 525 may include communication interface 526 for setting up and maintaining a wired or wireless connection with an interface of a different communication device of communication system 500, as well as radio interface 527 for setting up and maintaining at least wireless connection 570 with UE 530 located in a coverage area (not shown in FIG. 14) served by radio access network node 520. Communication interface 526 may be configured to facilitate connection 560 to host computer 510. Connection 560 may be direct or it may pass through a core network (not shown in FIG. 14) of the telecommunication system and/or through one or more intermediate networks outside the telecommunication system. In the embodiment shown, hardware 525 of radio access network node 520 further includes processing circuitry 528, which may comprise one or more programmable processors, application-specific integrated circuits, field programmable gate arrays or combinations of these (not shown) adapted to execute instructions. Radio access network node 520 further has software 521 stored internally or accessible via an external connection.

Communication system 500 further includes UE 530 already referred to. Its hardware 535 may include radio interface 537 configured to set up and maintain wireless connection 570 with a radio access network node serving a coverage area in which UE 530 is currently located. Hardware 535 of UE 530 further includes processing circuitry 538, which may comprise one or more programmable processors, application-specific integrated circuits, field programmable gate arrays or combinations of these (not shown) adapted to execute instructions. UE 530 further comprises software 531, which is stored in or accessible by UE 530 and executable by processing circuitry 538. Software 531 includes client application 532. Client application 532 may be operable to provide a service to a human or non-human user via UE 530, with the support of host computer 510. In host computer 510, an executing host application 512 may communicate with the executing client application 532 via OTT connection 550 terminating at UE 530 and host computer 510. In providing the service to the user, client application 532 may receive request data from host application 512 and provide user data in response to the request data. OTT connection 550 may transfer both the request data and the user data. Client application 532 may interact with the user to generate the user data that it provides.

It is noted that host computer 510, radio access network node 520 and UE 530 illustrated in FIG. 14 may be similar or identical to host computer 430, one of network nodes 412a, 412b, 412c and one of UEs 491, 492 of FIG. 13, respectively. This is to say, the inner workings of these entities may be as shown in FIG. 14 and independently, the surrounding network topology may be that of FIG. 13.

In FIG. 14, OTT connection 550 has been drawn abstractly to illustrate the communication between host computer 510 and UE 530 via radio access network node 520, without explicit reference to any intermediary devices and the precise routing of messages via these devices. Network infrastructure may determine the routing, which it may be configured to hide from UE 530 or from the service provider operating host computer 510, or both. While OTT connection 550 is active, the network infrastructure may further take decisions by which it dynamically changes the routing (e.g., on the basis of load balancing consideration or reconfiguration of the network).

Wireless connection 570 between UE 530 and radio access network node 520 is in accordance with the teachings of the embodiments described throughout this disclosure. One or more of the various embodiments improve the performance of OTT services provided to UE 530 using OTT connection 550, in which wireless connection 570 forms the last segment. More precisely, the teachings of these embodiments may reduce interference, due to improved classification ability of airborne UEs which can generate significant interference.

A measurement procedure may be provided for the purpose of monitoring data rate, latency and other factors on which the one or more embodiments improve. There may further be an optional network functionality for reconfiguring OTT connection 550 between host computer 510 and UE 530, in response to variations in the measurement results. The measurement procedure and/or the network functionality for reconfiguring OTT connection 550 may be implemented in software 511 and hardware 515 of host computer 510 or in software 531 and hardware 535 of UE 530, or both. In embodiments, sensors (not shown) may be deployed in or in association with communication devices through which OTT connection 550 passes; the sensors may participate in the measurement procedure by supplying values of the monitored quantities exemplified above, or supplying values of other physical quantities from which software 511, 531 may compute or estimate the monitored quantities. The reconfiguring of OTT connection 550 may include message format, retransmission settings, preferred routing etc.; the reconfiguring need not affect radio access node network node 520, and it may be unknown or imperceptible to radio access network node 520. Such procedures and functionalities may be known and practiced in the art. In certain embodiments, measurements may involve proprietary UE signalling facilitating host computer's 510 measurements of throughput, propagation times, latency and the like. The measurements may be implemented in that software 511 and 531 causes messages to be transmitted, in particular empty or 'dummy' messages, using OTT connection 550 while it monitors propagation times, errors etc.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The invention claimed is:

1. A method for determining direction of a user equipment with respect to a base station, where the base station is configured to communicate with beams in a beam set, the method being performed by a processing unit, the method comprising:

obtaining a vector of a plurality of radio parameter measurements from measurements performed on a radio link between the base station and the user equipment, wherein each of the plurality of radio parameter measurements are associated with a same location of the user equipment, wherein the vector comprises a radio parameter measurement per each beam in the beam set; and determining the direction, D, of the user equipment with respect to the base station by comparing the vector of radio parameter measurements to a set of candidate direction profiles, where each candidate direction profile represents one candidate direction, D, of the user equipment with respect to the radio access node, where each candidate direction profile comprises a radio parameter estimate per each beam in the beam set, and where the direction, D, of the user equipment with respect to the base station is given by the candidate direction of the candidate direction profile that, according to a similarity measure, is most similar to the vector of radio parameter measurements.

2. The method according to claim 1, wherein the similarity measure pertains to one of: correlation between the vector of radio parameter measurements and each of the candidate direction profiles, a norm between the vector of radio parameter measurements and each of the candidate direction profiles.

3. The method according to claim 1, further comprising:

estimating a quality level of the determined direction, D, of the user equipment with respect to the base station when comparing the vector of radio parameter measurements to the set of candidate direction profiles.

4. The method according to claim 3, wherein the quality level pertains to any of: a line of sight condition of the user equipment with respect to the base station, a service region condition of the user equipment with respect to the base station, an operational condition of the base station.

5. The method according to claim 4, wherein any of the line of sight condition, the service region condition, and the operational condition is fulfilled when one of the candidate direction profiles has a value of the similarity measure that is at least one of: higher than a predetermined threshold value, more than a predetermined factor higher than the value of the similarity measure for any other candidate direction profile.

6. The method according to claim 4, further comprising:

issuing a warning signal when at least one of the line of sight condition, the service region condition, and the operational condition is not fulfilled.

7. The method according to claim 3, further comprising:

estimating, using the vector of radio parameter measurements and the determined direction, D, of the user equipment with respect to the base station, at least one of: total radiated power of the base station, amount of resource elements used by the base station, equivalent isotropically radiated power of the base station; and providing, to an operations, administration and maintenance entity of the base station, information of the determined direction, D, of the user equipment with respect to the base station and/or the estimated total radiated power only when the quality level is above a predetermined threshold value.

8. The method according to claim 1, further comprising:

estimating, using the vector of radio parameter measurements and the determined direction, D, of the user equipment with respect to the base station, at least one of: total radiated power of the base station, amount of resource elements used by the base station, equivalent isotropically radiated power of the base station.

9. The method according to claim 1, wherein each of the candidate direction profiles comprises auxiliary data, and wherein the direction, D, of the user equipment with respect to the base station further is determined using the auxiliary data.

10. The method according to claim 1, wherein the base station is configured to communicate in accordance with a MIMO transmission codebook, and wherein information of the candidate direction profiles is comprised in the MIMO transmission codebook.

11. The method according to claim 1, wherein the radio parameter estimates are either precalculated values or previously obtained measurements.

12. The method according to claim 1, wherein the radio parameter measurements pertain to at least one of: power values, amplitude and phase values.

13. The method according to claim 1, wherein the measurements represent measurements performed by a second radio transceiver device on signals transmitted by the first radio transceiver device in the beam set.

14. The method according to claim 1, wherein the measurements represent measurements performed by the first radio transceiver device on signals received in the beams and transmitted by a second radio transceiver device.

15. A processing unit for determining direction of a user equipment with respect to a base station, where the base station is configured to communicate with beams in a beam set, the processing unit comprising processing circuitry, the processing circuitry being configured to cause the processing unit to:

obtain a vector of base station radio parameter measurements from measurements performed on a radio link between the base station and the user equipment, wherein each of the plurality of radio parameter measurements are associated with a same location of the user equipment, wherein the vector comprises a radio parameter measurement per each beam in the beam set; and determine the direction, D, of the user equipment with respect to the base station by comparing the vector of radio parameter measurements to a set of candidate direction profiles, where each candidate direction profile represents one candidate direction, D, of the user equipment with respect to the base station, where each candidate direction profile comprises a radio parameter estimate per each beam in the beam set, and where the direction, D, of the user equipment with respect to the base station is given by the candidate direction of the candidate direction profile that, according to a similarity measure, is most similar to the vector of radio parameter measurements.

16. The processing unit according to claim 15, wherein the similarity measure pertains to one of: correlation between the vector of radio parameter measurements and each of the candidate direction profiles, a norm between the vector of radio parameter measurements and each of the candidate direction profiles.

17. The processing unit according to claim 15, wherein the processing circuitry is configured to cause the processing unit to:

estimate a quality level of the determined direction, D, of the user equipment with respect to the base station when comparing the vector of radio parameter measurements to the set of candidate direction profiles.

18. The processing unit according to claim 17, wherein the quality level pertains to any of: a line of sight condition of the user equipment with respect to the base station, a service region condition of the user equipment with respect to the base station, an operational condition of the base station.

19. The processing unit according to claim 18, wherein any of the line of sight condition, the service region condition, and the operational condition is fulfilled when one of the candidate direction profiles has a value of the similarity measure that is at least one of: higher than a predetermined threshold value, more than a predetermined factor higher than the value of the similarity measure for any other candidate direction profile.

20. The processing unit according to claim 15, wherein the processing unit is part of the base station, the user equipment, or a network controller.

\* \* \* \* \*